(12) United States Patent
Lee

(10) Patent No.: US 10,001,805 B2
(45) Date of Patent: Jun. 19, 2018

(54) PORTABLE APPARATUS

(71) Applicant: Samsung Electronics Co., Ltd., Gyeonggi-do (KR)

(72) Inventor: Se-Yeon Lee, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 84 days.

(21) Appl. No.: 14/702,532

(22) Filed: May 1, 2015

(65) Prior Publication Data
US 2015/0359136 A1    Dec. 10, 2015

(30) Foreign Application Priority Data
Jun. 5, 2014   (KR) .................. 10-2014-0068345

(51) Int. Cl.
| | | |
|---|---|---|
| *H05K 7/20* | (2006.01) | |
| *H05K 9/00* | (2006.01) | |
| *G06F 1/16* | (2006.01) | |
| *H01L 23/36* | (2006.01) | |
| *H04B 1/036* | (2006.01) | |

(52) U.S. Cl.
CPC ............ *G06F 1/1613* (2013.01); *H01L 23/36* (2013.01); *H04B 1/036* (2013.01); *H05K 7/2039* (2013.01); *H05K 9/0022* (2013.01)

(58) Field of Classification Search
CPC .......... H05K 7/20409; H05K 7/20418; H05K 7/20436; H05K 7/20854
See application file for complete search history.

(56) References Cited

U.S. PATENT DOCUMENTS

| | | |
|---|---|---|
| 2013/0221910 A1 | 8/2013 | Kim et al. |
| 2015/0201533 A1* | 7/2015 | Daughtry, Jr. ........ H05K 9/0028 174/377 |

FOREIGN PATENT DOCUMENTS

| | | |
|---|---|---|
| JP | 2005197898 A | 7/2005 |
| KR | 20140031358 A | 3/2014 |

* cited by examiner

*Primary Examiner* — Robert J Hoffberg
*Assistant Examiner* — Hung Dang

(57) ABSTRACT

A portable apparatus that improves performance degradation of RF-related parts which may be incurred when a radiant heat sheet is attached to a shielding structure mounted in an RF block is provided. The apparatus blocks a feedback connection path which may be formed between heating parts by removing parts of the shielding structure and the radiant heat sheet which face a connection area between the heating parts.

14 Claims, 7 Drawing Sheets

PORTABLE APPARATUS

CROSS-REFERENCE TO RELATED APPLICATION AND CLAIM OF PRIORITY

The present application is related to and claims benefit under 35 U.S.C. § 119 to an application filed in the Korean Intellectual Property Office on Jun. 5, 2014 and assigned Serial No. 10-2014-0068345, the contents of which are incorporated herein by reference.

TECHNICAL FIELD

Exemplary embodiments of the present disclosure relate to a portable apparatus, and more particularly, to a structure for improving performance degradation of electronic parts that are mounted in a Radio Frequency (RF) block.

BACKGROUND

It is common that many electronic parts are mounted on a main board mounted in a portable apparatus. From among the mounted electronic parts, an RF block for transmitting and receiving wirelessly, that is, an RF transceiving circuit exists. In the case of the RF transceiving circuit, a shielding structure is mounted therein in various ways to shield from electromagnetic noise to minimize mutual interference of various noises. In recent years, a shielding can of a Surface Mounting Device (SMD) type serving as a shielding structure for the RF transceiving circuit is used to maximize productivity and also reduce a size.

As the portable apparatuses have been enhanced with higher performance, the circuit structure of the portable apparatuses has become complicated and the packing density of parts has increased. Therefore, the packing and wiring density of the main RF electronic parts including a transceiver, a transceiver power amplifier, a Low-Noise Amplifier (LNA) also increases.

For the reasons described above, various problems arise according to characteristics or arrangement of electronic parts, a wiring condition, or a GND condition. In particular, when an RF transceiver and an RF transceiver power amplifier are mounted in a single shielding structure close to each other, power outputted from the RF receiver power amplifier may use the shielding structure as a feedback path and thus may be led to the RF transceiver again. In this case, a phase-related characteristic of a transmission signal of the RF transceiver or an Error Vector Magnitude (EVM)-related or neighboring channel noise characteristic may be degraded.

SUMMARY

As the recent portable apparatus is equipped with a variety of functions and the performance of a main processor improves, power consumption increases. In addition, as the design of the portable apparatus becomes slim and light, heat emitted from the portable apparatus increases.

Therefore, various attempts have been made to minimize the increased temperature that a user feels when using the portable apparatus. For example, radiant heat sheets made of various materials including conductive metals are increasingly used to absorb and dissipate heat.

In addition, as the wireless data communication transmission speed has rapidly increased, an increase in the power consumption may be the main factor generating heat in the portable apparatus. As such, many radiant heat sheets are used on the periphery of an RF circuit responsible for physical transmission and reception of radio data. However, there may be problem in RF performance due to the use of the radiant heat sheets.

To address the above-discussed deficiencies, it is a primary object to provide a portable apparatus that applies a radiant heat sheet to improve heating characteristics and also prevents performance of an RF transceiver from being degraded.

According to an aspect of the present disclosure, a portable apparatus includes: two or more heating parts; a shielding structure disposed to enclose the heating parts; and a radiant-heat unit attached to the shielding structure to absorb heat transmitted from the heating parts and transmit the heat to a relatively lower-temperature area, and a part of the shielding structure and a part of the radiant-heat unit, which face a connection area between the heating parts are removed.

According to another aspect of the present disclosure, a portable apparatus includes structures for shielding a plurality of heating parts from noise and dissipating heat, and parts of the respective structures facing a connection area between the heating parts are removed.

The portable apparatus according to various exemplary embodiments of the present disclosure provides a shielding structure and a radiant heat sheet for electronic parts that are susceptible to noise and generate much heat. In addition, the portable apparatus can prevent performance degradation of a transceiver and maintain a radiant-heat function by blocking a power feedback path formed by the shielding structure and the radiant heat sheet.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

Figure 1:
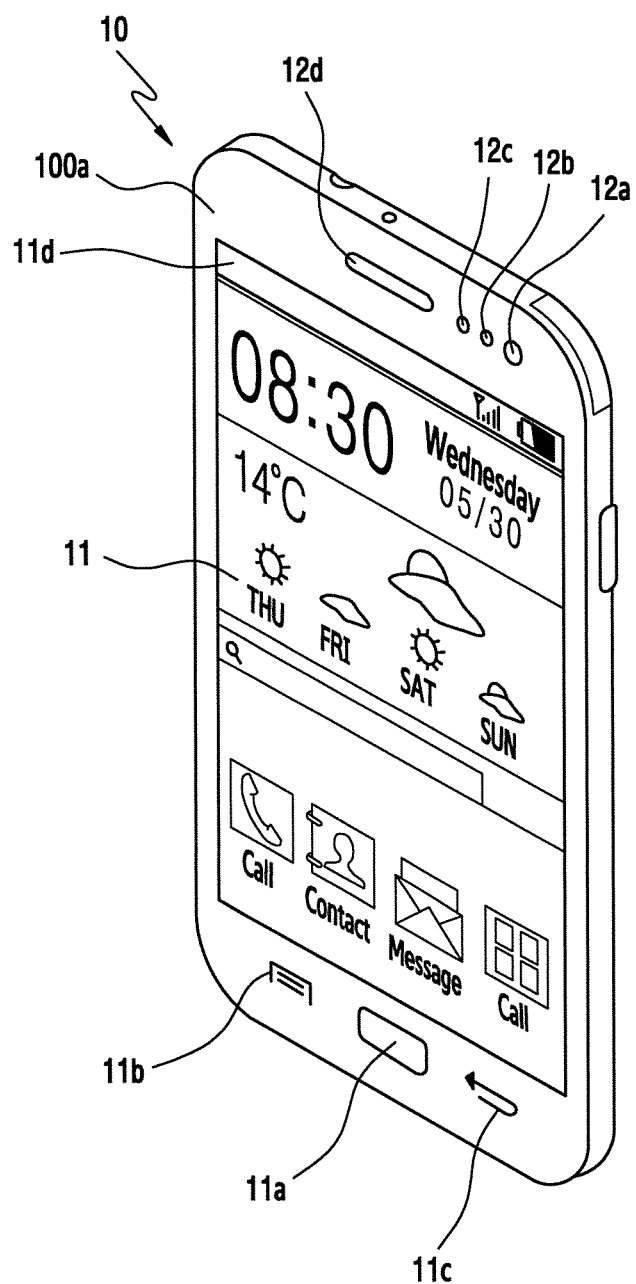
FIG. 1 illustrates a perspective view showing a front surface of a portable apparatus according to an exemplary embodiment.

FIGS. 1 through 7, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged wireless communication device. Hereinafter, various exemplary embodiments of the present disclosure will be explained with reference to the accompanying drawings. However, various exemplary embodiments of the present disclosure are not limited to the specific embodiments. In the following description, same reference numerals are used for the same elements when they are depicted in different drawings.

The terms such as "first" and "second" used in various exemplary embodiments of the present disclosure may be used to describe various elements, but do not limit the corresponding elements. These terms may be used for the purpose of distinguishing one element from another element. For example, a first element can be named a second element without departing from the scope of right of various exemplary embodiments of the present disclosure, and similarly, a second element can be named a first element. The terms used in exemplary embodiments of the present disclosure are just used to explain specific exemplary embodiments and are not intended to limit the present disclosure. As used herein, the singular forms are intended to include the plural forms as well, unless the context clearly indicates otherwise.

The term "substantially" used in exemplary embodiments of present disclosure is used to imply that a cited characteristic, parameter, or value is not necessarily achieved exactly and that an allowable error, a measurement error, a limitation of measurement accuracy, a deviation or change including other elements known to a person skilled in the art, and an effect that a characteristic intends to provide are not excluded.

Various exemplary embodiments of the present disclosure are applied to an "portable apparatus." However, this is a general term and it should be understood that various exemplary embodiments of the present disclosure can be equally applied to any one of a mobile phone, a palm sized Personal Computer (PC), a Personal Communication System (PCS), a Personal Digital Assistant (PDA), a mobile PC (Hand-Held PC (HPC)), a smartphone, a wireless Local Area Network (LAN) terminal, a laptop computer, a net book, a tablet PC, and the like. Therefore, the term "portable apparatus" should not be used to limit the exemplary embodiments to a specific type of apparatus.

Figure 2:
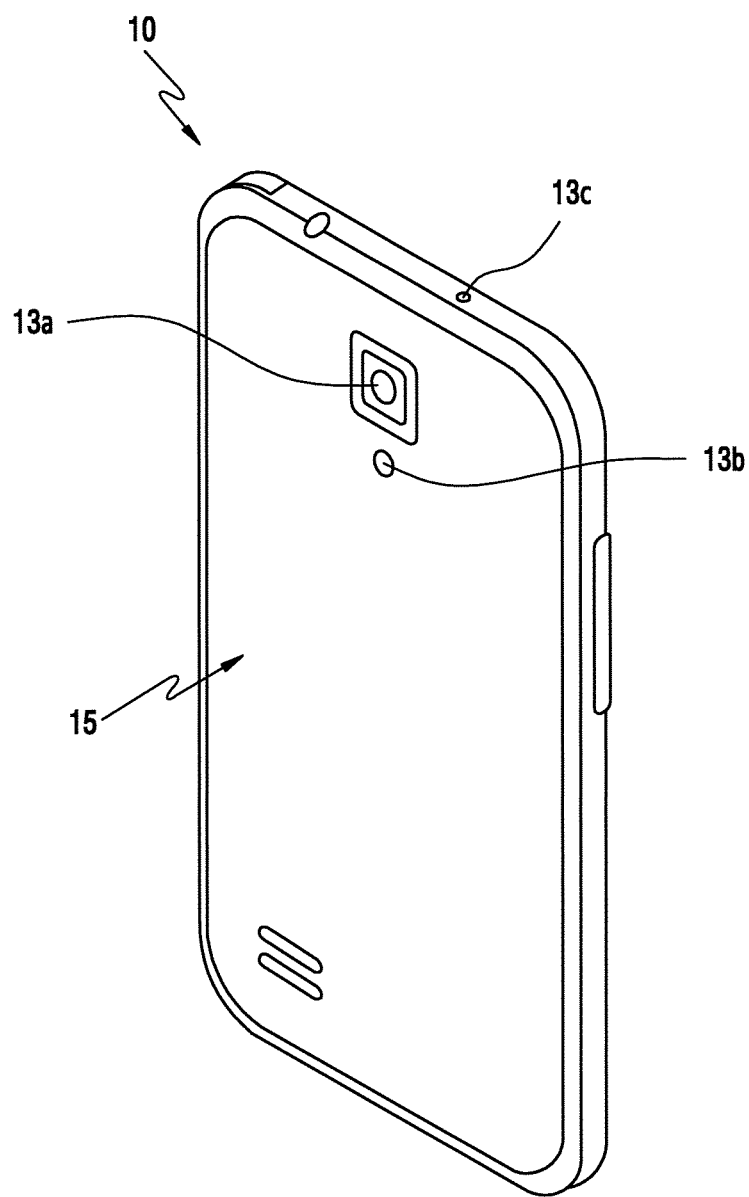
FIG. 2 illustrates a perspective view showing a rear surface of a portable apparatus according to an exemplary embodiment.

FIG. 1 illustrates a perspective view showing a front surface of a portable apparatus. FIG. 2 illustrates a perspective view showing a rear surface of a portable apparatus. The portable apparatus is a smartphone or a tablet PC. Referring to FIGS. 1 and 2, a schematic configuration of a portable apparatus will be explained on the assumption that the portable apparatus is a smartphone. A touch screen 11 is formed on the center of the front surface of the portable apparatus 10. The touch screen 11 is formed so large that the touch screen 11 occupies the greatest part of the front surface. In FIG. 1, a main home screen is displayed on the touch screen 11 by way of an example. The main home screen is the first screen that is displayed on the touch screen 11 when the portable apparatus 10 is turned on. In addition, when the portable apparatus 10 has different home screens of a plurality of pages, the main home screen is the first home screen from the home screens of the plurality of pages. Shortcut icons for executing frequently used applications, a main menu shift key, a date, weather, etc. are displayed on the main home screen. The main menu shift key displays a menu screen on the touch screen 11. In addition, a status bar 11d for displaying a status such as a battery charging status, strength of a received signal, and a current time are formed on the upper end of the touch screen 11. A home button 11a, a menu button 11b, and a back button 11c are formed on the lower portion of the touch screen 11.

The home button 11a displays a main home screen on the touch screen 11. For example, in a state in which a home screen, other than the main home screen or a menu screen, is displayed on the touch screen 11, and when the home button 11a is touched, the main home screen is displayed on the touch screen 11. In addition, when the home button 11a is touched while applications are being executed on the touch screen 11, the main home screen is displayed on the touch screen 11. In addition, the home button 11a can be used to display recently used applications or a task manager on the touch screen 11. The menu button 11b provides a connection menu that can be used on the touch screen 11. The connection menu includes a widget add menu, a background screen change menu, a search menu, an edition menu, an environment setting menu, etc. The back button 11c displays a screen that has been executed right before a currently executed screen or ends a most recently used application.

A first camera 12a, an illumination sensor 12b, and a proximity sensor 12c are arranged on the upper end area of the front surface of the portable apparatus 10. A second camera 13a, a flash 13b, and a speaker 13c are arranged on the rear surface of the portable apparatus 10.

Hereinafter, a shielding structure and a radiant-heat unit for a plurality of electronic parts mounted on a main board of a portable apparatus according to various exemplary embodiments will be explained along with a method for maintaining a radiant-heat function, while preventing performance degradation of a heating part.

Figure 3:
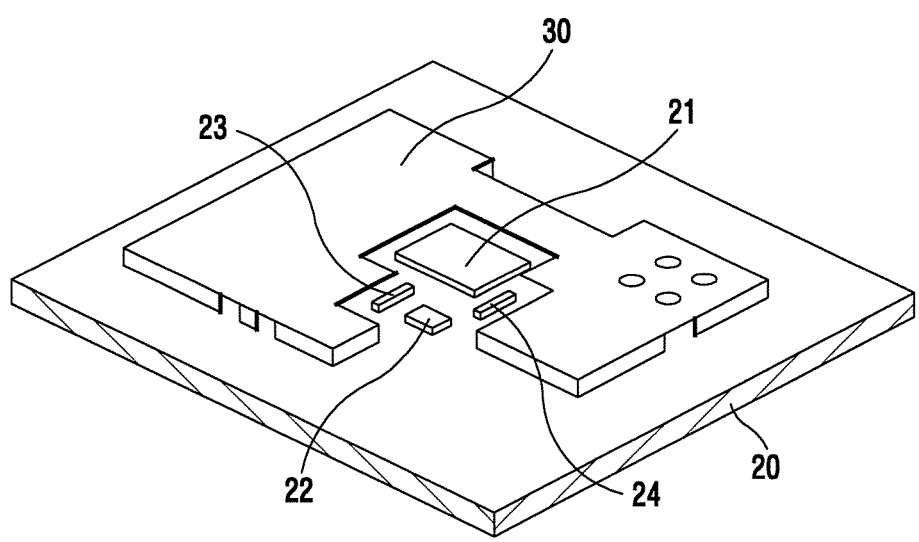
FIG. 3 illustrates a perspective view showing a shielding structure, for example, a shielding can, which is mounted for a heating part mounted on a main board according to an exemplary embodiment.

FIG. 3 illustrates a perspective view showing a shielding structure that is disposed for heating parts mounted on a main board of a portable apparatus according to an exemplary embodiment. Referring to FIG. 3, many electronic parts are mounted on the main board 20, which is mounted in the portable apparatus. For a RF transceiving circuit that transmits and receives wirelessly, a shielding structure 30 is installed in various ways to minimize mutual interference of various noises and thus shields from electromagnetic noise.

The shielding structure 30 serves to shield an RF circuit using a shielding structure of a Surface Mounting Device (SMD) type, for example, a shielding can. The shielding is disposed to enclose the electronic parts and can be made of a metallic material.

From among the electronic parts mounted on the main board 20, electronic parts 21-24 including an RF transceiver 21 and an RF transceiver power amplifier 22 generates much noise and much heat. Hereinafter, a shielding structure for the RF transceiver 21 and the RF transceiver power amplifier 22 will be explained by way of an example.

As described above, the shielding structure 30 of the RF transceiver 21 and the RF transceiver power amplifier 22 mounted on the main board has a problem that a phase-related characteristic of a transmission signal of the transceiver or an Error Vector Magnitude (EVM)-related or a neighboring channel noise characteristic is degraded. Therefore, a physical transmission path among the electronic parts is blocked by removing a part 300 of the shielding structure 30 where a feedback path is generated (the part is removed and illustrated in the form of an opening). When there is no problem in shielding a side surface or other parts, the shielding characteristic is not greatly affected.

Meanwhile, as the recent portable apparatus is equipped with a variety of functions and the performance of a main processor improves, power consumption increases. In addition, as the design of the portable apparatus becomes slim and light, heat emitted from the portable apparatus increases. Therefore, various attempts have been made to minimize the increased temperature that consumers feel. For example, radiant heat sheets made of various materials including conductive metals are increasingly used to absorb and dissipate heat.

In addition, as the wireless data communication transmission speed has rapidly increased, an increase in the power consumption may be the main factor generating heat in the portable apparatus. As such, many radiant heat sheets are used on the periphery of an RF circuit responsible for physical transmission and reception of radio data. However, there may be problem in RF performance due to the use of the radiant heat sheets.

Figure 4:
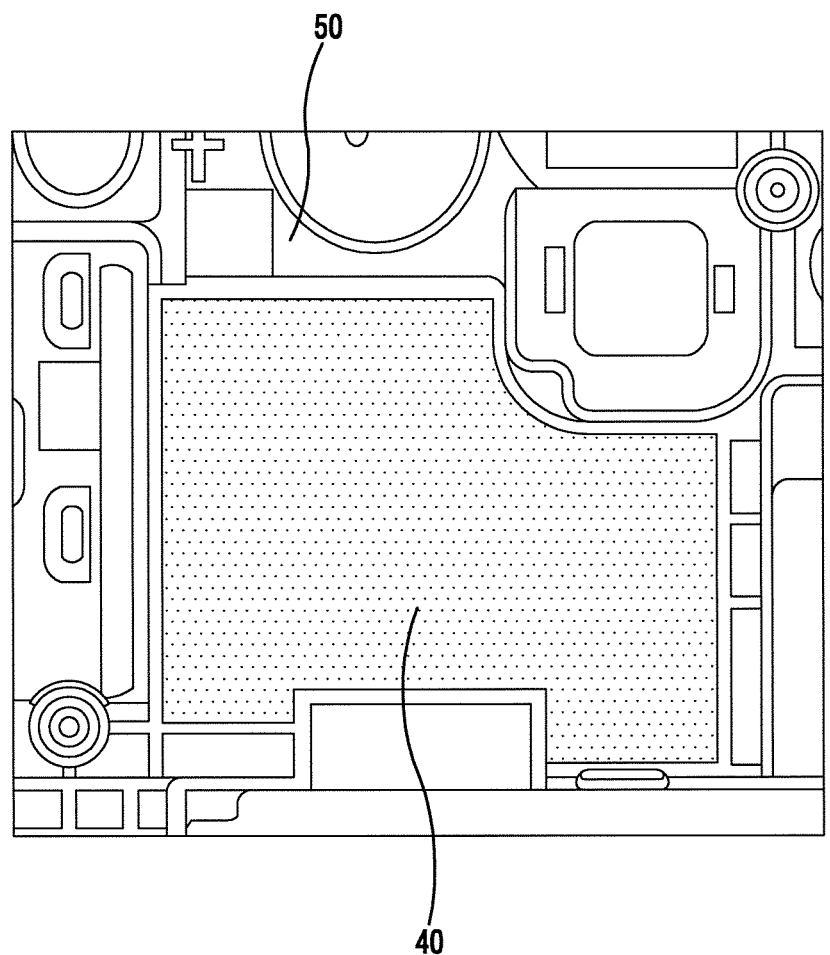
FIG. 4 illustrates a front view showing a state where a radiant heat sheet is attached to an internal structure according to an exemplary embodiment.
Figure 5:
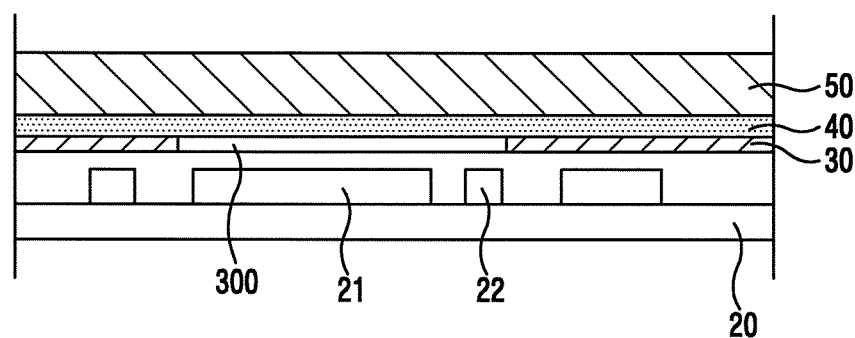
FIG. 5 illustrates a cross section view showing a structure for shielding and radiant heat of a heating part where noise is generated according to an exemplary embodiment.

FIG. 4 illustrates a front view showing a state in which a radiant heat sheet 40 is provided in an inner structure 50 according to an exemplary embodiment. FIG. 5 illustrates a cross section view showing a structure for shielding and dissipating heat of a heating part where noise is generated according to an exemplary embodiment. Referring to FIGS. 4 and 5, a structure to which a radiant-heat unit structure is applied will be explained.

As shown in FIGS. 4 and 5, the radiant-heat unit (radiant heat sheet 40) including a metallic component (for example, a copper material) is applied on the removed part 300 of the shielding structure 30 to improve performance degradation of the transceiver. However, a power feedback path of the transceiver 21 is regenerated due to the applied radiant heat sheet 40 and thus the performance of the transceiver 21 may be degraded. The degradation of the performance of the transceiver 21 may result from the material of the radiant heat sheet 40. The radiant heat sheet is configured by one or a combination of one or more of natural graphite particles, compressed particles of exfoliated graphite, artificial graphite particles, copper, graphene particles, carbon nanotubes (CNT), and graphene hybrid. The radiant heat sheet 40 physically connects a high-temperature area and a low-temperature area with each other, thereby absorbing heat emitted from the high-temperature area and transmitting the heat to the relatively lower-temperature area. Since the radiant heat sheet 40 includes a metallic material having good conductivity, such as copper, the radiant heat sheet 40 provides a power feedback path.

Referring to tables 1 and 2 presented below, EVM performance of an LTE band before and after the radiant heat sheet 40 is attached will be explained.

TABLE 1

| Test Item | BW | DL-RB | DL Modul | UL_RB | UL Modul | Min | Max | Unit | 37800 | 38000 | 38200 |
|---|---|---|---|---|---|---|---|---|---|---|---|
| 6.5.2.1 Error Vector Magnitude (EVM)_PUSCH_MAXP_DRMS | 10 | 50 | QPSK | 50 | QPSK | −1 | 17.5 | % | 3.77 | 5.72 | 5.18 |
| 6.5.2.1 Error Vector Magnitude (EVM)_PUSCH_MAXP_RMS | 10 | 50 | QPSK | 50 | QPSK | −1 | 17.5 | % | 4.08 | 5.50 | 5.51 |
| 6.5.2.1 Error Vector Magnitude (EVM)_PUSCH_CLOP_DRMS | 10 | 50 | QPSK | 12 | QPSK | −1 | 17.5 | % | 3.19 | 4.43 | 3.57 |
| 6.5.2.1 Error Vector Magnitude (EVM)_PUSCH_CLOP_RMS | 10 | 50 | QPSK | 12 | QPSK | −1 | 17.5 | % | 3.55 | 4.87 | 3.90 |
| 6.5.2.1 Error Vector Magnitude (EVM)_PUSCH_MAXP_DRMS | 10 | 50 | QPSK | 50 | Q16 | −1 | 12.5 | % | 4.37 | 6.50 | 5.18 |
| 6.5.2.1 Error Vector Magnitude (EVM)_PUSCH_MAXP_RMS | 10 | 50 | QPSK | 50 | Q16 | −1 | 12.5 | % | 5.28 | 8.20 | 6.36 |
| 6.5.2.1 Error Vector Magnitude (EVM)_PUSCH_CLOP_DRMS | 10 | 50 | QPSK | 12 | Q16 | −1 | 12.5 | % | 3.02 | 4.52 | 3.31 |
| 6.5.2.1 Error Vector Magnitude (EVM)_PUSCH_CLOP_RMS | 10 | 50 | QPSK | 12 | Q16 | −1 | 12.5 | % | 3.84 | 5.16 | 4.26 |

TABLE 2

| Test Item | BW | DL-RB | DL Modul | UL_RB | UL Modul | Min | Max | Unit | 37800 | 38000 | 38200 |
|---|---|---|---|---|---|---|---|---|---|---|---|
| 6.5.2.1 Error Vector Magnitude (EVM)_PUSCH_MAXP_DRMS | 10 | 50 | QPSK | 50 | QPSK | −1 | 17.5 | % | 16.20 | 16.24 | 16.24 |
| 6.5.2.1 Error Vector Magnitude (EVM)_PUSCH_MAXP_RMS | 10 | 50 | QPSK | 50 | QPSK | −1 | 17.5 | % | 11.47 | 11.46 | 14.49 |
| 6.5.2.1 Error Vector Magnitude (EVM)_PUSCH_CLOP_DRMS | 10 | 50 | QPSK | 12 | QPSK | −1 | 17.5 | % | 4.12 | 4.00 | 4.02 |
| 6.5.2.1 Error Vector Magnitude (EVM)_PUSCH_CLOP_RMS | 10 | 50 | QPSK | 12 | QPSK | −1 | 17.5 | % | 4.36 | 4.31 | 4.36 |
| 6.5.2.1 Error Vector Magnitude (EVM)_PUSCH_MAXP_DRMS | 10 | 50 | QPSK | 50 | Q16 | −1 | 12.5 | % | 14.65 | 16.06 | 17.26 |

TABLE 2-continued

| Test Item | BW | DL-RB | DL Modul | UL_RB | UL Modul | Min | Max | Unit | 37800 | 38000 | 38200 |
|---|---|---|---|---|---|---|---|---|---|---|---|
| 6.5.2.1 Error Vector Magnitude (EVM)_PUSCH_MAXP_RMS | 10 | 50 | QPSK | 50 | Q16 | −1 | 12.5 | % | 13.25 | 13.40 | 15.16 |
| 6.5.2.1 Error Vector Magnitude (EVM)_PUSCH_CLOP_DRMS | 10 | 50 | QPSK | 12 | Q16 | −1 | 12.5 | % | 4.13 | 4.03 | 3.75 |
| 6.5.2.1 Error Vector Magnitude (EVM)_PUSCH_CLOP_RMS | 10 | 50 | QPSK | 12 | Q16 | −1 | 12.5 | % | 4.79 | 4.71 | 4.53 |

Referring to tables 1 and 2, it can be seen that performance of the transceiver 21 is degraded by the radiant heat sheet 40. This results from the radiant heat sheet 40 including a metallic component having good thermal conductivity, such as copper.

Hereinafter, a structure that applies a radiant heat sheet to improve a heating characteristic and also does not degrade an RF performance characteristic of an RF transceiver according to various exemplary embodiments of the present disclosure will be explained with reference to FIGS. 6 and 7.

Figure 6:
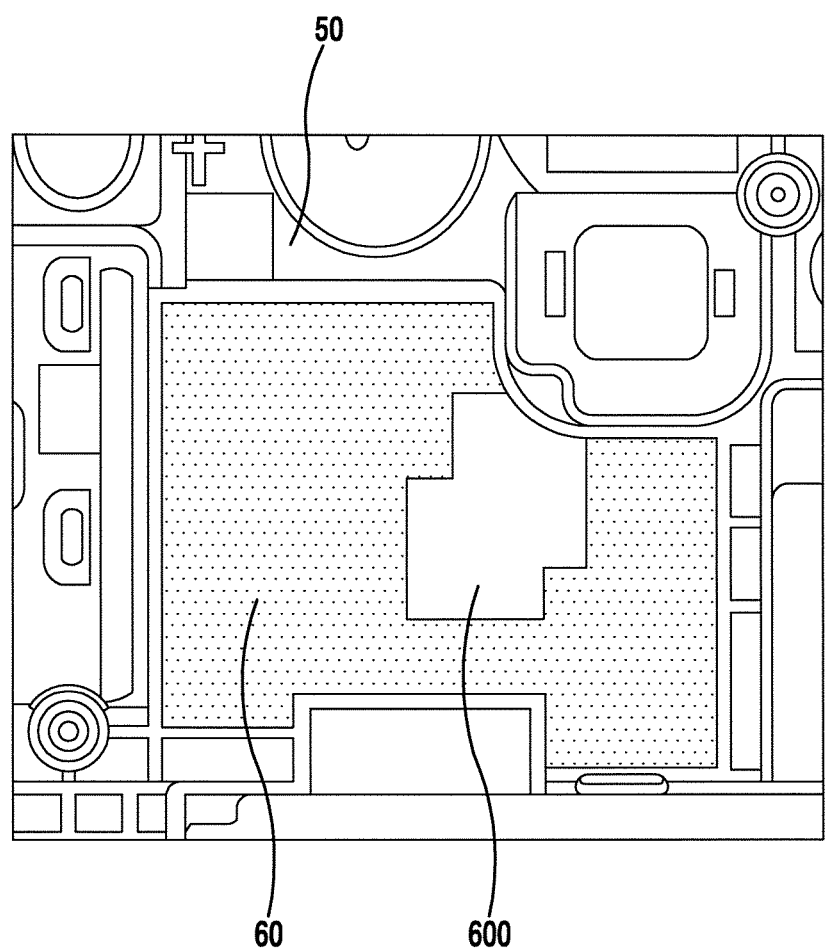
FIG. 6 illustrates a front view showing a state in which a radiant heat sheet is attached to an inner structure according to various exemplary embodiments of the present disclosure.

FIG. 6 illustrates a front view showing a state in which a radiant heat sheet is attached to an inner structure according to various exemplary embodiments of the present disclosure. FIG. 7 illustrates a cross section view showing a structure for shielding and radiant-heat of a heating part where noise is generated according to various exemplary embodiments of the present disclosure.

Figure 7:
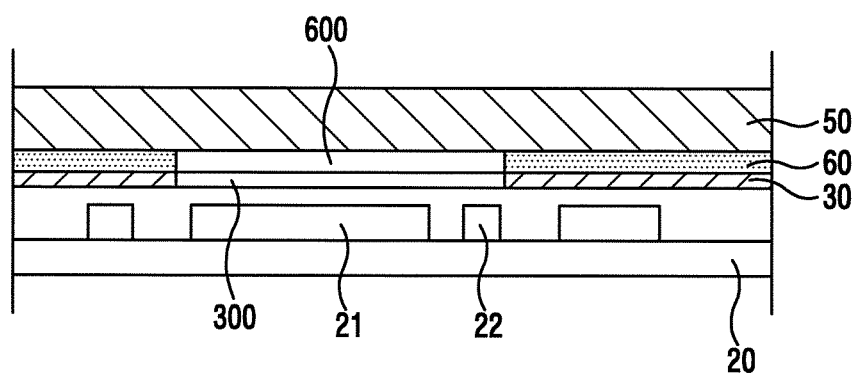
FIG. 7 illustrates a cross section view showing a structure for shielding and dissipating heat of a heating part where noise is generated according to various exemplary embodiments of the present disclosure.

As shown in FIGS. 6 and 7, the portable apparatus generally includes, as a heat source mounted on the main board 20, electronic parts such as a main processor, an application processor, a power amplifier, a Light Emitting Diode (LED) element, a battery, etc. Therefore, the places where the above-mentioned parts are disposed and the periphery thereof are the hottest areas and may be regarded as hot spots. In particular, from among the above-mentioned heating parts, the main processor, the application processor, or the battery emit a lot of heat when being operated. Therefore, a radiant heat sheet is provided to absorb the heat emitted from the heating parts and transmit the heat to a relatively lower-temperature area.

From among the connected heating parts, an RF transceiver 21 and an RF transceiver power amplifier 22 disposed on the periphery of the RF transceiver 21, constituting an RF transceiving circuit block, which generates much noise and thus should be shielded and emit much heat, will be explained by way of an example. The apparatus according to various exemplary embodiments of the present disclosure includes two or more heating parts 21 and 22, which are mounted on the main board 20, a shielding structure 30, and a radiant heat sheet 60. In addition, the apparatus according to various exemplary embodiments of the present disclosure may have opened shapes 300 and 600 (openings) formed by removing parts of the shielding structure 30 and the radiant heat sheet 60. The removed parts of the shielding structure 30 and the radiant heat sheet 60 have opening shapes. A feedback path between the heating parts 21 and 22 is blocked by the openings 300 and 600, which are formed by removing parts of the shielding structure 30 and the radiant heat sheet 60. The "removed part" of the shielding structure 30 and the "opening" formed by removing are interchangeably used, and the "removed part" of the radiant heat sheet 60 and the "opening" formed by removing are interchangeably used. The removed part 300 of the shielding structure 30 and the removed part 600 of the radiant heat sheet 60 can have a same or similar shape. The removed parts 300 and 600 can be parts of the shielding structure and the radiant heat sheet facing a connection area between the heating parts. The above-mentioned connection area may indicate a space formed between the heating parts. In addition, the removed parts 300 and 600 can be parts of the shielding structure and the radiant heat sheet facing the respective heating parts. In other words, the removed parts 300 and 600 include areas facing the heating parts, for example, removed rectangular or square areas.

The RF transceiver 21 may be referred to as a first heating part where noise is generated, and the RF transceiver power amplifier 22 may be referred to as a second heating part where noise is generated. The first and second heating parts 21-24 mentioned in this exemplary embodiment may be defined as electronic parts generating much noise and much heat.

The radiant heat sheet 60 is disposed face-to-face with the shielding structure 30, and absorbs the heat transmitted from the first and second heating parts 21 and 22 and transmits the heat to a relatively lower-temperature area. The low-temperature area is a bracket or a casing that is arranged in the portable apparatus as an internal supporting structure 50. The first and second heating parts 21 and 22 are disposed directly facing the internal supporting structure due to the removed parts 300 and 600.

Table 3 (identical to table 1) and table 4 presented below show a result of comparing the radiant heat sheet 40 (shown in FIG. 5) without any part being removed (without an opening), and the radiant heat sheet 60 from which a part is removed according to various exemplary embodiments in view of EVM performance:

TABLE 3

| Test Item | BW | DL-RB | DL Modul | UL_RB | UL Modul | Min | Max | Unit | 37800 | 38000 | 38200 |
|---|---|---|---|---|---|---|---|---|---|---|---|
| 6.5.2.1 Error Vector Magnitude (EVM)_PUSCH_MAXP_DRMS | 10 | 50 | QPSK | 50 | QPSK | −1 | 17.5 | % | 3.77 | 5.72 | 5.18 |
| 6.5.2.1 Error Vector Magnitude (EVM)_PUSCH_MAXP_RMS | 10 | 50 | QPSK | 50 | QPSK | −1 | 17.5 | % | 4.08 | 5.50 | 5.51 |
| 6.5.2.1 Error Vector Magnitude (EVM)_PUSCH_CLOP_DRMS | 10 | 50 | QPSK | 12 | QPSK | −1 | 17.5 | % | 3.19 | 4.43 | 3.57 |
| 6.5.2.1 Error Vector Magnitude (EVM)_PUSCH_CLOP_RMS | 10 | 50 | QPSK | 12 | QPSK | −1 | 17.5 | % | 3.55 | 4.87 | 3.90 |
| 6.5.2.1 Error Vector Magnitude (EVM)_PUSCH_MAXP_DRMS | 10 | 50 | QPSK | 50 | Q16 | −1 | 12.5 | % | 4.37 | 6.50 | 5.18 |
| 6.5.2.1 Error Vector Magnitude (EVM)_PUSCH_MAXP_RMS | 10 | 50 | QPSK | 50 | Q16 | −1 | 12.5 | % | 5.28 | 8.20 | 6.36 |

TABLE 3-continued

| Test Item | BW | DL-RB | DL Modul | UL_RB | UL Modul | Min | Max | Unit | 37800 | 38000 | 38200 |
|---|---|---|---|---|---|---|---|---|---|---|---|
| 6.5.2.1 Error Vector Magnitude (EVM)_PUSCH_CLOP_DRMS | 10 | 50 | QPSK | 12 | Q16 | −1 | 12.5 | % | 3.02 | 4.52 | 3.31 |
| 6.5.2.1 Error Vector Magnitude (EVM)_PUSCH_CLOP_RMS | 10 | 50 | QPSK | 12 | Q16 | −1 | 12.5 | % | 3.84 | 5.16 | 4.26 |

TABLE 4

| Test Item | BW | DL-RB | DL Modul | UL_RB | UL Modul | Min | Max | Unit | 37800 | 38000 | 38200 |
|---|---|---|---|---|---|---|---|---|---|---|---|
| 6.5.2.1 Error Vector Magnitude (EVM)_PUSCH_MAXP_DRMS | 10 | 50 | QPSK | 50 | QPSK | −1 | 17.5 | % | 5.54 | 3.79 | 3.56 |
| 6.5.2.1 Error Vector Magnitude (EVM)_PUSCH_MAXP_RMS | 10 | 50 | QPSK | 50 | QPSK | −1 | 17.5 | % | 5.34 | 3.97 | 4.29 |
| 6.5.2.1 Error Vector Magnitude (EVM)_PUSCH_CLOP_DRMS | 10 | 50 | QPSK | 12 | QPSK | −1 | 17.5 | % | 4.60 | 3.43 | 4.07 |
| 6.5.2.1 Error Vector Magnitude (EVM)_PUSCH_CLOP_RMS | 10 | 50 | QPSK | 12 | QPSK | −1 | 17.5 | % | 5.05 | 3.60 | 4.99 |
| 6.5.2.1 Error Vector Magnitude (EVM)_PUSCH_MAXP_DRMS | 10 | 50 | QPSK | 50 | Q16 | −1 | 12.5 | % | 5.79 | 3.77 | 3.80 |
| 6.5.2.1 Error Vector Magnitude (EVM)_PUSCH_MAXP_RMS | 10 | 50 | QPSK | 50 | Q16 | −1 | 12.5 | % | 6.81 | 3.81 | 4.18 |
| 6.5.2.1 Error Vector Magnitude (EVM)_PUSCH_CLOP_DRMS | 10 | 50 | QPSK | 12 | Q16 | −1 | 12.5 | % | 4.66 | 3.08 | 3.97 |
| 6.5.2.1 Error Vector Magnitude (EVM)_PUSCH_CLOP_RMS | 10 | 50 | QPSK | 12 | Q16 | −1 | 12.5 | % | 5.45 | 3.64 | 5.21 |

Referring to tables 3 and 4, it can be seen that the performance of the transceiver 21 is not degraded by the radiant heat sheet 60, and the same performance as when the radiant heat sheet 60 is not attached can be guaranteed.

TABLE 5

| SPECIFICATION | SURFACE TEMPERATURE (MAKING A CALL WITH WCDMA B1 MAX POWER) | | | | REMARKS |
|---|---|---|---|---|---|
| EXISTING RADIANT SHEET | 10 MINUTES 34.2 | 15 MINUTES 35.9 | 20 MINUTES 36.9 | 25 MINUTES 37.4 | |
| PROPOSED RADIANT SHEET | 11 MINUTES 34.9 | 15 MINUTES 35.9 | 20 MINUTES 36.9 | 25 MINUTES 37.5 | EQUAL IN COMPARISON WITH EXISTING RADIANT SHEET |

Table 5 shows a result of comparing heating characteristics before and after the radiant heat sheet according to various exemplary embodiments of the present disclosure is employed. It can be seen that the radiant heat sheet 600 proposed according to various exemplary embodiments of the present disclosure provides a surface temperature almost equal to that of the existing radiant heat sheet 40. That is, the radiant-heat performance is not degraded even when a part of the radiant heat sheet is removed.

In conclusion, the portable apparatus according to various exemplary embodiments of the present disclosure can prevent the heating parts from being degraded by maintaining the shielding structure of the RF transceiver 21 and the RF transceiver power amplifier 22 mounted on the main board adjacent to each other, as the existing shielding structure (illustrated in FIG. 3), and also, provide a structure (the radiant heat sheet shown in FIG. 7) that can improve the radiant-heat function in comparison with the existing structure.

In addition, the portable apparatus according to various exemplary embodiments includes a structure which can prevent a main disclosure part (RF transceiver) between the two heating parts 21 and 22 from being degraded, and which can maintain the heat-dissipating function even when parts of the shielding structure and the radiant heat sheet are removed. The same effect may be applied to a part among three or four heating parts.

In addition, the portable apparatus according to various exemplary embodiments of the present disclosure is applied to the RF transceiving circuit block that generates much noise and much heat by way of an example. However, the portable apparatus can be applied to other parts that generate much noise and much heat.

According to various exemplary embodiments, at least part of the apparatus (for example, modules or functions) or method (for example, operations) of the present disclosure is implemented by using instructions stored in a computer-readable storage medium in the form of a programming module. When the instructions are executed by one or more processors (for example, the processor 210), the one or more processors perform a function corresponding to the instructions. In certain embodiments, the computer-readable storage medium is the memory 220, for example. In certain embodiments, at least part of the programming module is implemented (for example, executed) by using the processor 210. In certain embodiments, at least part of the programming module includes a module, a program, a routine, sets of instructions, a process, and the like for performing one or more functions.

Examples of the computer-readable recording medium include magnetic media such as hard disks, floppy disks and magnetic tapes, optical media such as Compact Disc Read Only Memories (CD-ROMs) and Digital Versatile Disc (DVDs), magneto-optical media such as floptical disks, and hardware devices such as Read Only Memories (ROMs), Random Access Memories (RAMs) and flash memories that are especially configured to store and execute program commands (for example, the programming module). Examples of the program commands include machine language codes created by a compiler, and high-level language codes that can be executed by a computer by using an interpreter. The above-described hardware devices can be configured to operate as one or more software modules for performing operations of various exemplary embodiment of the present disclosure, and vice versa.

A module or programming module according to various exemplary embodiments of the present disclosure includes one or more of the above-described elements, may omit some elements, or further includes additional elements. The operations performed by the module, the programming module, or the other elements according to various exemplary embodiments of the present disclosure can be performed serially, in parallel, repeatedly, or heuristically. In addition, some operation can be performed in different order or may omitted, and an additional operation can be added.

While the disclosure has been shown and described with reference to certain preferred embodiments thereof, it will be understood by those skilled in the art that various changes in form and details may be made therein without departing from the spirit and scope of the disclosure as defined by the appended claims. Therefore, the scope of the disclosure is defined not by the detailed description of the disclosure but by the appended claims, and all differences within the scope will be construed as being included in the present disclosure. Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A portable apparatus comprising:
   two or more heating parts;
   a shielding structure disposed to enclose the heating parts; and
   a radiant-heat unit attached to the shielding structure and configured to absorb heat transmitted from the heating parts and to transmit the heat to a relatively lower-temperature area from the heating parts, and
   wherein a part of the shielding structure and a part of the radiant-heat unit that face a connection area between the heating parts are removed,
   wherein the removed part of the radiant-heat unit is configured in a form of an opening,
   wherein the radiant-heat unit is configured in a form of a sheet and is attached to an inner structure of the portable apparatus and contacts the shielding structure such that the radiant-heat unit and the shielding structure contact face-to-face,
   wherein the radiant-heat unit is interposed between the inner structure of the portable apparatus and the shielding structure,
   wherein the removed part of the shielding structure and the removed part of the radiant-heat unit have a same shape, respectively, and
   wherein the connection area is a space formed between the heating parts.

2. The portable apparatus of claim 1, wherein each of the removed parts of the shielding structure and the part of the radiant-heat unit comprises an area facing each of the heating parts.

3. The portable apparatus of claim 1, wherein the heating parts comprise an RF transceiver and an RF transceiver power amplifier disposed on a periphery of the RF transceiver.

4. The portable apparatus of claim 1, wherein the removed part of the shielding structure and the part of the radiant-heat unit comprise a metallic material.

5. The portable apparatus of claim 1, wherein the shielding structure comprises an SMD type shielding can, and a removed part of the shielding structure is configured in a form of an opening.

6. The portable apparatus of claim 1, wherein the relatively lower-temperature area comprises an internal structure contacting the radiant-heat unit face-to-face.

7. The portable apparatus of claim 1, wherein the heating parts are disposed to directly face a low-temperature area via the removed parts.

8. A portable apparatus comprising:
   one or more shielding structures configured to shield a plurality of heating parts from noise and radiant-heat, wherein parts of the respective shielding structures facing a connection area between the heating parts are removed, and
   wherein a structure for shielding from radiant heat is attached to the shielding structure and contacts an internal structure having a relatively lower temperature than those of the heating parts, such that heat is transmitted from the heating parts to the internal structure,
   wherein each of the removed parts is formed in a form of an opening and the heating parts directly face the internal structure,
   wherein a radiant-heat unit is configured in a form of a sheet and is attached to an inner structure of the portable apparatus and contacts the shielding structure such that the radiant-heat unit and the shielding structure contact face-to-face,
   wherein the radiant-heat unit is interposed between the inner structure of the portable apparatus and the shielding structure,
   wherein the removed part of the shielding structure and the removed part of the radiant-heat unit have a same shape, respectively, and
   wherein the connection area is a space formed between the heating parts.

9. The portable apparatus of claim 8, wherein each of the removed parts of the shielding structures comprises an area facing each of the heating parts.

10. The portable apparatus of claim 8, wherein each of the removed parts of the shielding structures comprises a metallic material.

11. A heat shield apparatus configured to shield heat generated from components within a portable terminal, the heat shield apparatus comprising:
    a shielding structure disposed to enclose the components; and
    a radiant-heat unit attached to the shielding structure and configured to absorb heat transmitted from the components and to transmit the heat to a relatively lower-temperature area from heating parts, and
    wherein a part of the shielding structure and a part of the radiant-heat unit that face a connection area between the heating parts are removed,
    wherein the removed part of the radiant-heat unit is configured in a form of an opening,
    wherein the radiant-heat unit is configured in a form of a sheet and is attached to an inner structure of the portable terminal and contacts the shielding such that the radiant-heat unit and the shielding structure contact face-to-face,
    wherein the radiant-heat unit is interposed between the inner structure of the portable terminal and the shielding structure, wherein the removed part of the shielding structure and the removed part of the radiant-heat unit have a same shape, respectively, and wherein the connection area is a space formed between the heating parts.

12. The heat shield apparatus of claim 11, wherein each of the removed parts of the shielding structure and the part of the radiant-heat unit comprises an area facing each of the components.

13. The heat shield apparatus of claim 11, wherein the components comprise an RF transceiver and an RF transceiver power amplifier disposed on a periphery of the RF transceiver.

14. The heat shield apparatus of claim 11, wherein the removed part of the shielding structure and the part of the radiant-heat unit comprise a metallic material.

* * * * *